United States Patent [19]

Haydon

[11] 3,896,298

[45] *July 22, 1975

[54] COUNTING DEVICE

[75] Inventor: Arthur W. Haydon, Middlebury, Conn.

[73] Assignee: Tri-tech, Inc., Waterbury, Conn.

[ * ] Notice: The portion of the term of this patent subsequent to Jan. 22, 1991, has been disclaimed.

[22] Filed: July 6, 1973

[21] Appl. No.: 376,950

Related U.S. Application Data

[62] Division of Ser. No. 197,343, Nov. 10, 1971, Pat. No. 3,787,663.

[52] U.S. Cl. ........ 235/92 C; 235/92 EA; 235/92 R; 235/136

[51] Int. Cl. .......... G06m 1/276

[58] Field of Search ............. 235/92 EA, 92 C, 136; 340/347 P

[56] References Cited

UNITED STATES PATENTS

| | | | |
|---|---|---|---|
| 3,223,322 | 12/1965 | Hoffman | 235/136 |
| 3,387,267 | 6/1968 | Little | 340/347 P |
| 3,497,138 | 2/1970 | Fisher | 235/92 EA |
| 3,585,370 | 6/1971 | Kubler | 235/92 EA |
| 3,659,083 | 4/1972 | Winter et al. | 235/92 EA |
| 3,683,368 | 8/1972 | Ebner | 340/347 P |
| 3,787,663 | 1/1974 | Haydon | 235/92 C |

*Primary Examiner*—Gareth D. Shaw
*Assistant Examiner*—Joseph M. Thesz, Jr.
*Attorney, Agent, or Firm*—Lee C. Robinson, Jr.

[57] ABSTRACT

A transfer counter in which the higher order register drums are controlled by planetary gearing carried on flexible, resiliently biased transfer arms and in which lugs or depressions on the periphery of the drums actuate a series of switches to provide coded electrical signals which correspond to the angular positions of the drums. The switches are mounted on a single printed circuit read-out board for all of the drums which extends in a plane parallel to the drums' axis of rotation. The transfer of the drums is prevented during the electrical reading of the switches, and for resettable counters the switches are rendered inactive when the counters are being reset.

15 Claims, 15 Drawing Figures

COUNTING DEVICE

This is a division of application Ser. No. 197,343 filed Nov. 10, 1971, now U.S. Pat. No. 3,787,663.

BACKGROUND OF THE INVENTION

This invention relates to counting devices and more particularly to sequence counters, digital clocks, thumb wheel switches and similar devices in which the successive positions of the individual counting elements control electrical read-out circuitry to provide an indication of the condition of the counter at a remote location.

The present invention, while of general application, is particularly well suited for use with counting devices of the type which include resiliently biased transfer arms and associated planetary gearing for transferring motion from each counting element to the next higher order counting element. Representative counters of this type are disclosed, for example, in A. W. Haydon U.S. Pat. No. 3,069,083 granted Dec. 18, 1962 and in G. O. Hoffman U.S. Pat. No. 3,223,322 granted Dec. 14, 1965. Such counters utilize a series of indicia bearing counting elements, customarily in the form of register drums, which are rotatably supported about a common axis and are maintained in driving relationship with each other by planetary gearing. Each of the drums is provided with an integrally formed cam which cooperates with a follower carried by a supporting arm for the planetary gearing. The particular gear ratios and the surface contour of each cam are such that, as a given drum in a decade counter, for example, rotates from its "zero" position to its "nine" position, the next higher order drum remains stationary. As the given drum is rotated from its "nine" position to its "zero" position, however, the planetary gearing actuates the higher order drum to rotate it through a 36 degree angle, thus advancing the higher order drum one digit. The support arm for the planetary gearing is provided with a biasing spring which, during the movement of the given drum from "zero" to " nine", gradually builds up and stores the necessary force to drive the higher order drum with a substantial driving force.

Heretofore, difficulties have been encountered in the construction and operation of counting devices, such as those of the Geneva or transfer pinion type, and these difficulties have been of special moment in cases in which it is desired to provide an electrical indication of the angular positions of the individual drums or other counting elements. As an illustration, many previous attempts used wiper contacts or similar switching means on the radial web of each drum to minimize the load on the drum, but even so, such designs required the application of an excessively high input torque to the drive mechanism for the drums. In Geneva or transfer pinion counters, for example, these difficulties were of particular concern, and the available input torque was often insufficient to operate the higher order drums. In addition, in several of the electrical read-out counters previously employed, the switching means exhibited low current carrying capacity, and the counters required an undesireably large number of electrical connections. Because of such difficulties, in many cases individual electro-mechanical driving mechanisms were provided for each drum, and while this solved the problem of inadequate driving force to reliably operate the contacts, it further complicated the overall counter design, and for counters having several drums it was necessary to add highly complex electrical interconnections and drive circuitry to produce the desired movement of the higher order drum in response to a preselected portion of the movement of the next lower order drum. Further problems were encountered heretofore in cases in which motion was being transferred to a higher order drum during the electrical reading of the drums and also when the counter was being reset to zero. These latter difficulties occasionally resulted in extraneous or inaccurate electrical indications of the angular positions of the drums.

SUMMARY

One general object of this invention, therefore, is to provide a new and improved counting device having an electrical read-out capability.

More specifically, it is an object of this invention to provide such a counting device in which the operating torque required to reliably drive the device is substantially unaffected by the electrical read-out feature.

Another object of this invention is to provide a counting device of the character indicated in which the electrical read-out circuitry exhibits comparatively large current-carrying capacity and requires fewer electrical interconnections than the counters used heretofore.

A further object of the invention is to provide a transfer counter in which the transfer of motion to the individual counting elements is automatically prevented during the electrical reading of the counter.

Still another object of this invention is to provide a transfer counter of the resettable type in which the electrical read-out circuitry is inhibited during the resetting of the counter.

A still further object of this invention is to provide an electro-mechanical counter utilizing comparatively simple electrical and mechanical components which is economical to manufacture and thoroughly reliable in operation.

In one illustrative embodiment of this invention, there is provided a counting device which comprises a plurality of indicia bearing register drums in coaxial relationship with each other. Each of the drums includes switch actuating means which is arranged in accordance with a binary or other predetermined code. A transfer mechanism is located between adjacent drums for operating each higher order drum in response to the operation of the adjacent lower order drum and in predetermined relationship therewith. A series of switches cooperates with the switch actuating means on each drum to provide an electrical circuit condition representative of the angular position of the drums.

In accordance with one feature of the invention, in certain particularly important embodiments, the switch actuating means on each drum is located at spaced intervals around the drum's periphery. This construction is extremely compact, and the individual switches are positively controlled at all times.

In accordance with another feature of the invention, in several advantageous arrangements, the counting device includes a single printed circuit readout board with extends in a plane parallel to the axis of the drums. The use of a single read-out board of this character further enhances the overall compactness of the device and provides a substantial reduction in the number of electrical interconnections.

In accordance with a further feature of some embodiments of the invention, the transfer means between adjacent drums is resiliently biased and serves to store energy for use in driving the higher order drums. The stored energy is more than sufficient to overcome the drag resulting from the read-out switches and to provide a positive drive for the higher order drums. In some cases the transfer means includes a transfer arm in the form of a curved flexible leaf spring which further assists in insuring a positive drive for the drums at all times.

In accordance with many good arrangements, the counter includes means responsive to the read-out circuitry for preventing operation of the transfer mechanisms during the reading of the electrical signals. With this arrangement, the possibility of an erroneous reading during transfer is affirmatively prevented.

In certain preferred embodiments of the invention, transfer counters of the resettable type include a unique mechanism for automatically moving the read-out switches away from the individual drums when the counter is being reset. The read-out circuitry is thus deactivated during the resetting of the drums, with the result that extraneous electrical signals are avoided.

The present invention, as well as further objects and features thereof, will be understood more clearly and fully from the following description of certain preferred embodiments, when read with reference to the accompanying drawings.

DESCRIPTION OF CERTAIN PREFERRED EMBODIMENTS

Figure 1:
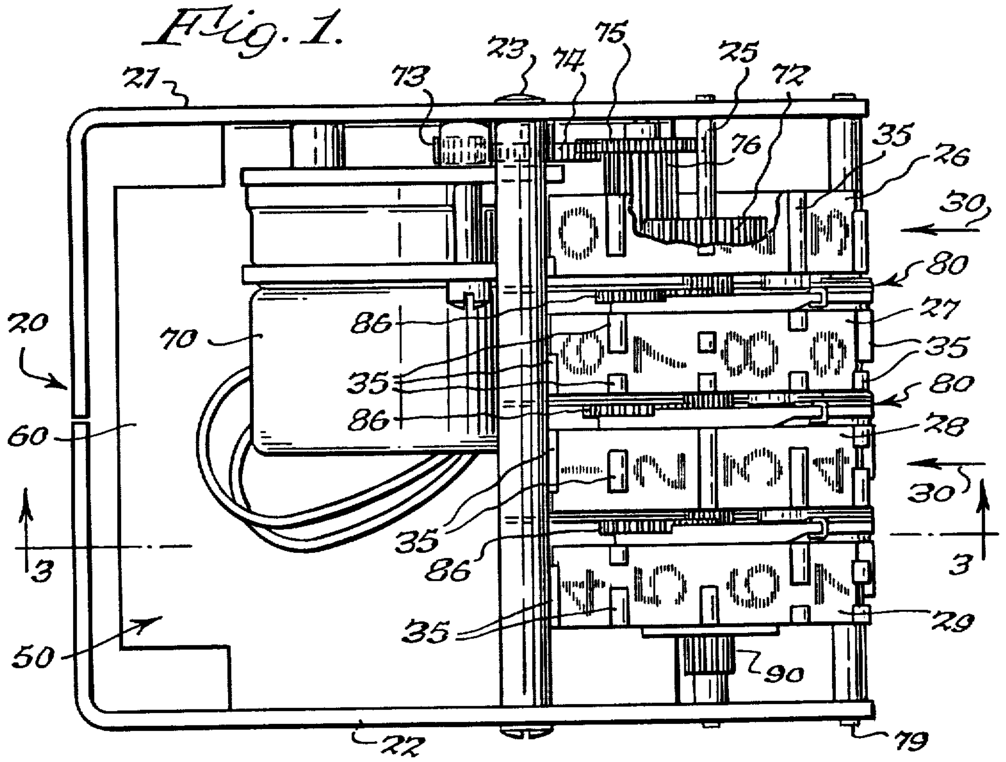
FIG. 1 is a top plane view of a transfer counter in accordance with one illustrative embodiment of the invention.
Figure 2:
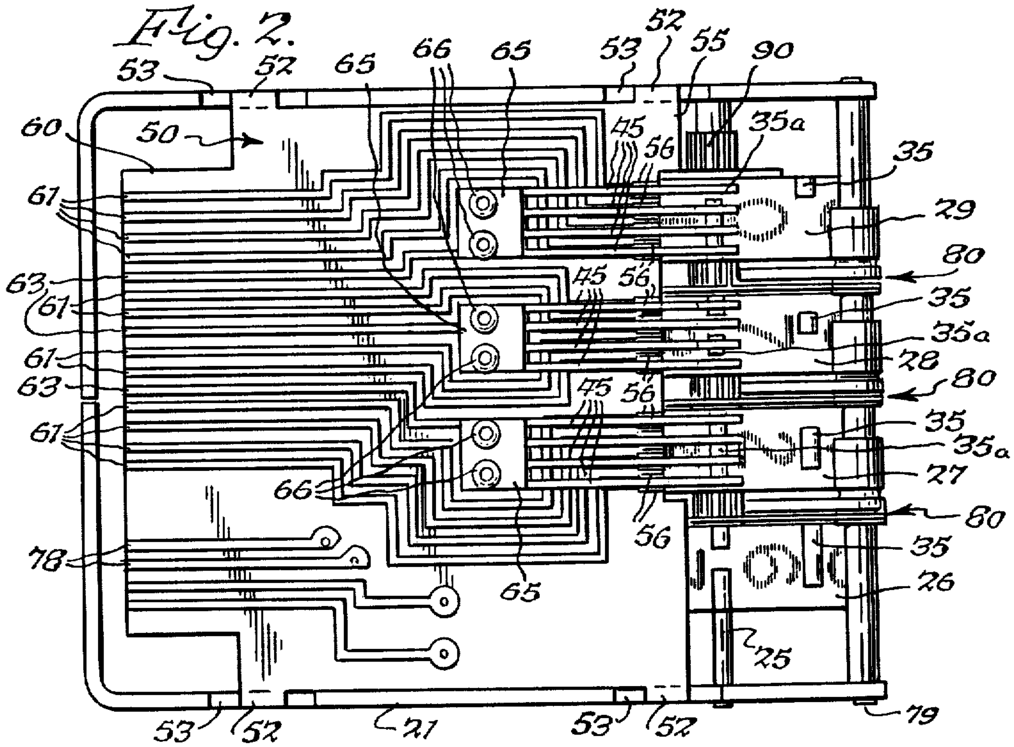
FIG. 2 is a bottom plan view of the counter.

Referring to FIGS. 1 and 2 of the drawings, there is shown a counting device, illustratively in the form of a transfer counter, which has a generally U-shaped frame 20. The frame 20 is assembled from two legs 21 and 22 which are maintained in spaced relationship with each other by a pair of posts 23. Extending between the outer portions of the legs 21 and 22 is a stationary shaft 25 which supports a series of counting elements in the form of register drums 26–29. These drums are arranged to provide a decade counter with each drum bearing indicia from "0" to "9". The indicia is visually readable by viewing the drums in the direction of the arrows 30. Each drum is freely rotatable on the shaft 25 and advances one digit each time the drum moves through an angle of 36°.

Figure 3:
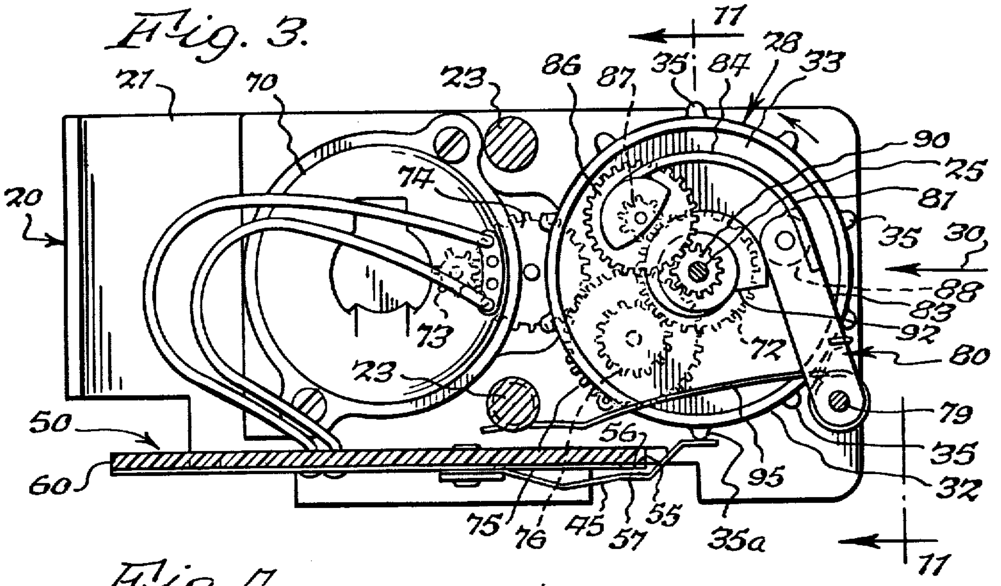
FIG. 3 is a vertical sectional view taken along the line 3—3 in FIG. 1.

The counter drums 26–29 are of identical molded plastic construction. As best shown by the drum 28 in FIGS. 3 and 11, the drums include indicia bearing flanges 32 about their outer peripheries which are spaced from the axis of the shaft 25 by integrally formed webs 33. The webs 33 are located with respect to the flanges 32 such that recesses are formed in both faces of the drums which, in the interests of compactness, accommodate substantial portions of the various operating components of the counter. The drums are arranged in progressively increasing order on the shaft 25 from the lowest order drum 26 to the highest order drum 29.

Figure 4:
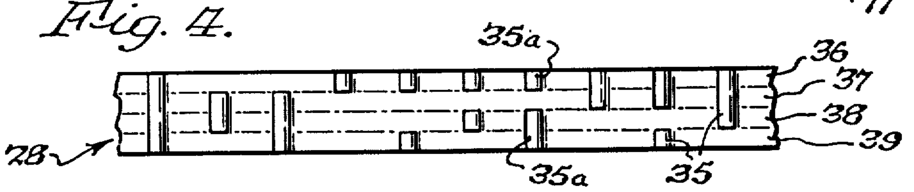
FIG. 4 is a fragmentary developed plan view of the periphery of one of the drums of the counter.

Integrally molded on the periphery of each of the counter drums 26–29 is a series of protruding lugs 35. As best shown in the developed view of FIG. 4, the lugs 35 extend in directions parallel to the axis of the counter and are arranged in accordance with a predetermined code, with a different lug configuration for each of the ten digits on the drum. In the case of a four bit binary code, for example, the surface of each drum is divided into four peripheral areas 36, 37, 38 and 39, and the lug 35 representing the digit "1" extends over the areas 36, 37 and 38, the lug representing the digit "2" extends over the areas 36, 37 and 39, the lug representing the digit "3" extends over the areas 36 and 37, etc. The lug for each digit is arranged approximately 90° from the read position of that digit in a direction opposite the direction of rotation of the drum. For example, if the digit "4" is being read along the horizontal read line 30, the lug 35*a* representing that digit is disposed in its lowermost position, that is, a position which is displaced 90° from the read line in a clockwise direction, as viewed in FIG. 3.

The various lugs 35 on the three higher order counter drums 27, 28 and 29 cooperate with a contact comb which comprises three sets of contact springs 45. Four of the springs 45 are provided in each set, one for each of the four peripheral areas 36, 37, 38 and 39 on the corresponding drum. The springs extend in directions transverse to the rotational axis of the drums and are resiliently biased into engagement with the drum's peripheries. As the drums rotate to bring the lugs into contact with the springs, the springs are cammed outwardly in accordance with the preset code and move from the full line position shown in FIG. 5 to the dotted line position, for purposes that will become more fully apparent hereinafter.

The lugs 35 on the lowest order drum 26, while having no spring actuating function, are provided so that all of the drums will be uniform, thus simplifying their manufacture.

The contact springs 45 are each carried by a single printed circuit board 50. The board 50 is of flat, substantially rectangular configuration and is provided with tabs 52 (FIG. 2) which fit in corresponding notches 53 in the legs 21 and 22 of the U-shaped frame 20. With this arrangement, the board 50 is mounted in a stationary position, and the plane of the board is parallel to the rotational axis of the drums 26–29 about the shaft 25.

The forward edge 55 of the printed circuit board 50 is spaced in close juxtaposition with the peripheries of the drums 26–29 and is provided with a series of printed circuit contacts 56, one for each of the springs 45. Each of these contacts is arranged to mate with a flat contact portion 57 on the corresponding spring. The pairs of contacts are normally closed but are opened in response to the movement of one of the lugs 35 into engagement with the spring.

Figures 5, 6:
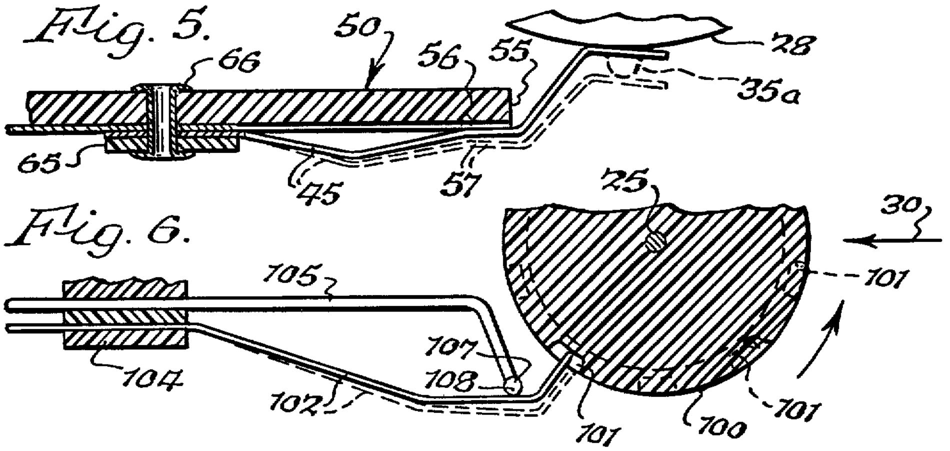
FIG. 5 is an enlarged fragmentary vertical sectional view of one of the switching fingers and associated parts for the counter.
FIG. 6 is a fragmentary vertical sectional view similar to FIG. 5 but showing an alternative switch and drum construction for the counter.

The rear edge 60 of the printed circuit board 50 serves as a plug-in connection and is provided with a multiplicity of terminals 61. Each of the terminals 61 is electrically connected by the printed circuitry on the board 50 to one of the contacts 56 at the forward edge 55. The rear edge 50 includes three additional terminals 63, one for each of the register drums 27, 28 and 29, and each of these latter terminals is electrically connected to one of the three sets of contact springs 45. As best shown in FIGS. 2 and 5, each set of springs 45 is held in place on the board 50 by a rectangular plate 65 and a rivet 66. The arrangement is such that, with a given spring 45 in its closed position, an electrically conductive path is established from the appropriate terminal 63, along the printed circuitry on the board 50 to the spring 45, across the contacts 56 and 57, and then back along the board 50 to the corresponding terminal 61. The springs 45 for each of the drums 27–29 serve as switches to provide a circuit condition representative of the angular position of the drums.

The drive mechanism for the counter includes an electric motor 70 which is suitably supported by the U-shaped frame 20. Although a wide variety of motors may be used to drive the counter, illustrative motors that are particularly advantageous are disclosed, for example, in A. W. Haydon U.S. Pat. Nos. 3,495,107, 3,495,111, 3,495,113, 3,370,189, 3,469,132 and 3,564,314. In the illustrated embodiment the motor is an a.c. synchronous clock motor and is employed to drive the drum 26 continuously to perform a timing function, although in other embodiments the motor operates as a stepper motor to advance the drum 26 in successive digital increments. The counter illustratively is designed as a running time meter, to record and totalize successive elapsed time periods, with the drum 26 denoting tenths of minutes. The counter stores and provides a visual reading of the total elapsed time to the nearest tenth of a minute, but the electrical reading of the counter is in whole minutes. For this reason there is no need to provide a set of contact springs 45 and associated circuitry for the drum 26. In cases in which a stepper motor is used to drive the drum 26, additional contact springs and circuitry may be used for that drum to enable the electrical reading of all of the drums.

The output shaft of the motor 70 is connected to a driving gear 72 through a reduction gear train including a motor pinion 73 and idler gears 74, 75 and 76. The driving gear 72 is integrally molded with the drum 26 and is located on the side of the web 33 opposite that facing the next highest order drum 27. The input leads for the motor are electrically connected to terminals 78 on the rear edge 60 of the printed circuit board 50.

A stationary rod 79 extends between the legs 21 and 22 of the frame 20 in a direction parallel to that of the posts 23. The rod 79 pivotally supports three resiliently biased transfer mechanisms 80 which are located between adjacent register drums 26–29 and serve to transfer motion from each lower order drum to the next higher order drum. Each of the mechanisms 80 comprises a transfer arm 81 (FIG. 3) which illustratively is molded from suitable plastic material. The arm 81 includes a straight rigid portion 83, which is pivotally supported at one end by the rod 79, and a curved flexible portion 84. This latter portion extends along an arc substantially concentric with the drum shaft 25 and is provided at its free end with a rotary planetary gear assembly comprising a large diameter gear 86 and a smaller gear 87 integrally formed therewith. A roller 88 is carried intermediate the ends of the arm 81 at the point at which the arm portions 83 and 84 meet.

Integrally molded on the side of each of the drums 26–29 adjacent the next higher order drum is a pinion 90. The planetary gears 86 and 87 on each of the transfer arms 81 are in respective meshing engagement with the pinion 90 on the corresponding drum and the driving gear 72 for the next higher order drum. The various gear ratios are such that a ten-to-one reduction is provided between each pair of adjacent drums, thus rotating each higher order drum one-tenth of a revolution for each revolution of the lower order drum.

Figures 8, 9, 10, 11, 12, 13:
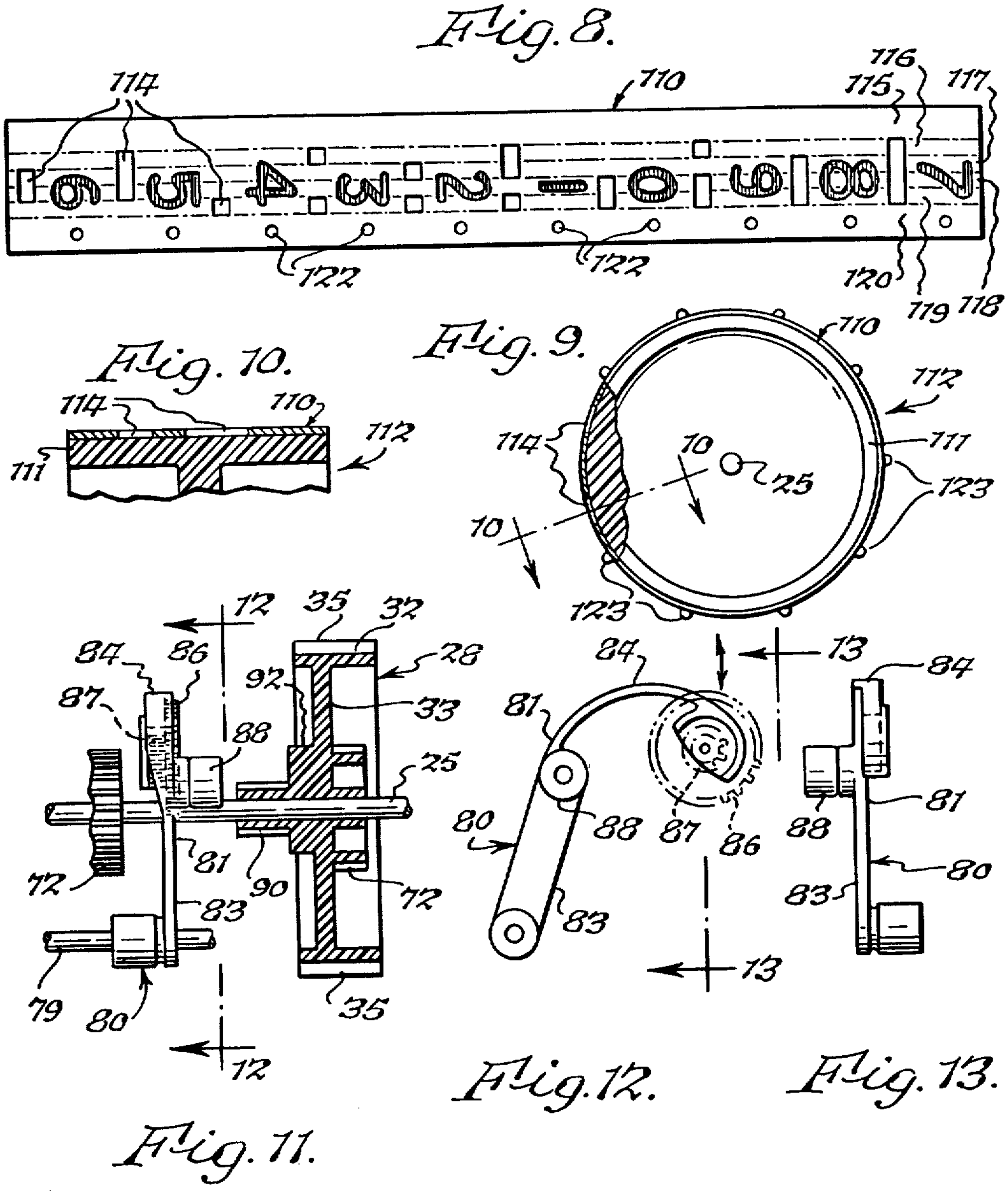
FIG. 8 is a developed plan view of the periphery of another alternative counter drum.
FIG. 9 is a side elevational view, with certain portions broken away and in section, of the counter drum illustrated in FIG. 8.
FIG. 10 is an enlarged fragmentary sectional view taken along the line 10—10 in FIG. 9.
FIG. 11 is a vertical sectional view taken generally along the line 11—11 in FIG. 3, with certain parts omitted and other shown in displaced positions for purposes of clarity.
FIG. 12 is a side elevational view of a flexible resiliently biased transfer arm for the counter.
FIG. 13 is an end elevational view of the transfer arm shown in FIG. 12, as seen from the line 13—13 in that FIG.

The counter is designed to limit the effectiveness of each of the transfer mechanisms 80 to transfer motion from a lower order drum to the adjacent higher order drum except during selected portions of the operation cycle. During the time a given drum moves from its "0" position to its "9" position, for example, it is desirable to modify the action of the adjacent transfer mechanism to prevent the transfer of motion to the next higher order drum. As the drum moves between its "9" and "0" positions, however, the transfer mechanism is rendered effective to rotate the higher order drum one-tenth of a revolution. For this purpose each of the drums 26–29 is provided with motion modifying means which comprises an integrally formed compensating cam 92. As best shown in FIG. 11, this cam is located on the side of the drum web 33 facing the next higher order drum between the drive pinion 90 and the web. The roller 88 on the transfer arm 81 is resiliently urged into engagement with the surface of the cam 92 by a wire spring 95 which is supported by one of the posts 23 and extends around the rigid portion 83 of the arm 81 adjacent the rod 79. One of the springs 95 is provided for each of the arms 81, and the springs exert a resilient bias on the arms to normally maintain rhe roller 88 in contact with its cam. The rigid portion 83 of the arm holds the roller 88 at a fixed radius from the axis of the rod 79, while the flexible portion 84 resiliently urges the planetary gears 86 and 87 into mesh with their respective gears 90 and 72.

During the rotation of the lowest order drum 26 in the direction of increasing count, its pinion 90 acts on the planetary gears 86 and 87 in a direction which tends to produce similar rotation of the adjacent higher order drum 27. However, as the drum 26 rotates from its "0" position to its "9" position, the compensating cam 92 urges the roller 88 away from the drum shaft 25 to pivot the transfer arm 81 and the gears 86 and 87 about the rod 79 against the biasing force of the spring 95. The cam 92 is of single lobe construction and is contoured such that the movement of the gears 86 and 87 away from the shaft 25 exactly compensates for the tendency of the gears to drive the higher order drum, with the result that the higher order drum remains stationary.

Upon the movement of the lower order drum 26 between its "9" position and its "0" position, the roller 88 drops off the lobe of the cam 92 under the action of the stored energy in the spring 95 and enables the rapid rotation of the higher order drum through a 36° angle to move this latter drum between its "0" and "1" positions. The arrangement is such that, at the time motion is transferred to each higher order drum, the energy needed to rotate the drum is derived from the spring 95, rather than from the input to the lowest order drum. As a result, even for counters having a large plurality of drums which simultaneously transfer from their "9" positions to their "0" positions, the imposition of substantial impact forces on the main input drive is eliminated.

During the movement of the drums 27–29, the lugs 35 on the drums open and close selected ones of the switch contacts 56 and 57 in accordance with the angular positions of the drum. For each successive position the condition of the contacts 56 and 57 corresponds to the information along the read line 30. The counter thus serves as an electrical data storage device, determined by the condition of the set of contacts, and in addition provides a visual indication of the stored data. As each drum transfers in response to its transfer mechanism 80, one or more of the contact springs 45 in the corresponding comb is cammed outwardly by the lugs 35 to break the circuit between the contacts 56 and 57, while upon movement of the lugs 35 away from the springs 45 the corresponding contacts close to complete the circuit. Although the springs 45 produce a slgiht drag because of their frictional engagement with the peripheries of the drums, the drag is more than overcome by the energy stored in the wire springs 95, with the result that no substantial resistance to movement is imposed on the drive mechanism for the counter during the transfer.

To electrically read the information stored within the counter, current pulses are applied to each of the terminals 63 (FIG. 2). The current follows a path from the terminals 63, along the printed circuitry on the board 50 to the individual springs 45, and then, for those springs which are in their closed positions, across the contacts 56 and 57 and back along the corresponding printed circuit path on the board to the read-out terminals 61. The signals at the terminals 61 are applied to appropriate utilization apparatus (not shown) of conventional design.

The embodiment illustrated in FIGS. 1–5 is particularly well suited for use in the recording and totalizing of successive elapsed time periods. The information stored in the counter and available visually represents the total elapsed time to the nearest tenth of a minute, the lowest order drum 26 representing tenths. For billing or other purposes, however, in which only whole minutes are to be used, the electrical read-out signals from the printed circuit board 50 provide a convenient source of the needed information, and yet the counter continues to accumulate and store data in tenths of minutes so that no error is introduced as a result of successive electrical readings.

Figure 7:
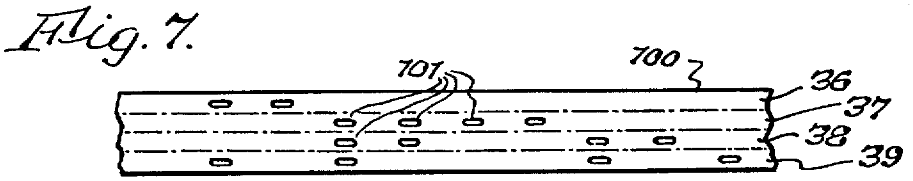
FIG. 7 is a fragmentary developed plan view of the periphery of the drum shown in FIG. 6.

Certain embodiments of the invention utilize depressions in the peripheral surfaces of the counter drums, rather than protruding lugs, to actuate the individual contact springs. In FIGS. 6 and 7, for example, there is shown a counter drum 100 having a series of spaced depressions 101 around its periphery. The depressions 101 are oriented in accordance with a suitable code in four peripheral areas 36, 37, 38 and 39 in a manner similar to that described heretofore with respect to the lugs 35. Four wire contact springs 102 are resiliently urged into engagement with the periphery of the drum 100, and one end of each spring is arranged to move in and out of the depressions 101 in a particular peripheral area as the drum rotates. The opposite end of each spring 102 is supported by an insulating block 104 which is suitably mounted on a single printed circuit board, such as the board 50 of FIGS. 1–5, for all of the drums. The block 104 also supports a stationary wire contact member 105. The member 105 extends from the block 104 toward the drum 100 in a direction substantially parallel to the springs 102 and then bends at a right angle to provide a transverse contact portion 107 which is common to each of the four springs. The contact portion 107 is located in position to be engaged by corresponding contact portions 108 on the springs. As in the previously described embodiment, the contact portions 107 and 108 for all of the drums lie in a straight line which is parallel to the drums' rotational axis.

As the drum 100 rotates, the springs 102 move in and out of the corresponding depressions 101 and close and then open the contact portions 107 and 108 in accordance with the information stored in the drum. Upon the movement of a given contact portion 108 into engagement with the portion 107, an electrical circuit is completed between the corresponding spring 102 and the member 105. The spring 102 and the member 105 are suitably connected to the printed circuitry on the board 50 (FIG. 2), such that, upon the application of suitable read signals to the appropriate terminals 63, information is read out from the terminals 61 in accordance with the stored data.

Referring to FIGS. 8–10, there is shown a conductive tape 110 which is carried by the peripheral flange 111 of a counter drum 112. The tape 110 preferably comprises a backing strip of Mylar, Teflon or other suitable polyester having a layer of copper foil laminated to its outer surface. The foil is etched away in particular areas to form depressions 114. These depressions are arranged in accordance with a binary code in a manner similar to the depressions 101 in FIGS. 6 and 7 and cooperate with contact springs, such as the springs 102, in the manner described heretofore.

The tape 110 is divided into six peripheral areas 115–120. The four centermost areas 116–119 correspond to the peripheral areas 36–39 (FIGS. 4 and 7) in the embodiments described above and contain the depressions 114 for the selective actuation of the contact springs on the printed circuit board. The area 115 extends along one edge of the tape 110 and accommodates a suitable wiper contact (not shown). The wiper contact may be similar to one of the contact springs and may be supplied with current to electrically read the counter. The current flows from the wiper contact along the conductive foil on the tape 110 to those contact springs which are in engagement with the foil. No current flows to the remaining springs, that is, the springs which are located within the depressions 114, with the result that the signals appearing at the output terminals of the apparatus constitute a binary representation of the data stored within the counter.

In some cases the laminated tape 110 is in the form of a belt to indicate 24 hours or 31 days, etc. For this purpose the tape 110 is provided with a series of indexing holes 122 at spaced intervals within the peripheral area 120. The holes 122 accommodate protruding teeth 123 on the periphery of the drum to provide a driving connection between the tape and the drum.

The invention is equally well suited for use with counting devices of the resettable type. In situations in which it is desired to inhibit the read-out circuitry of the counter during resetting, the computer or other apparatus which receives the read-out information may be electrically deactivated in response to the reset signal to prevent the reading of the stored data as the counter returns to its "0" or other null position.

Figure 14:
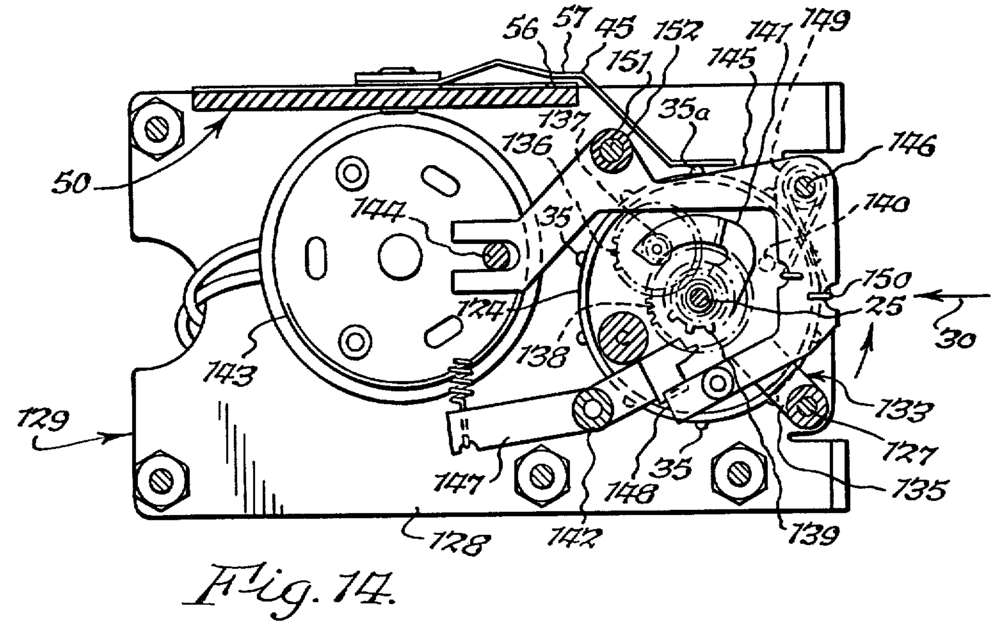
FIG. 14 is a vertical sectional view of a transfer counter in accordance with another illustrative embodiment of the invention.

Alternatively, the read-out feature of the counter may be inhibited mechanically during reset by deactivating the individual contact springs on the drums. As an illustration, in FIG. 14 there is shown a resettable counter of the general type disclosed in Hoffman U.S. Pat. No. 3,223,322, referred to heretofore but which has been modified to include electrical read-out components such as the peripheral lugs 35 on the individual counter drums 124, the contact springs 45, the printed circuit board 50 and the contact portions 56 and 57. A rod 127 is disposed between the legs 128 of the U-shaped frame 129 of the counter, and this rod supports a series of resiliently biased transfer mechanisms 133. Each of the mechanisms 133 includes a rigid transfer arm 135 pivotally carried by the rod 127 and a pair of planetary gears 136 and 137 which are rotatably supported adjacent the free end of the transfer arm. The gears 136 and 137 are in position to engage a driving gear 138 and a drive pinion 139 to transfer motion to the next higher order drum in a manner similar to that described heretofore with respect to the planetary gears 86 and 87. A follower 140 is mounted intermediate the ends of the arm 135, and a radius arm 141 extends between the central shaft 25 of the counter and the outer end of the arm 135 to maintain the axis of the gears 136 and 137 at a fixed distance from the shaft. The follower 140 cooperates with a compensating cam (not visible in FIG. 14) of a configuration similar to the cam 92 shown in FIG. 3.

As more fully described in the Hoffman patent, the driving gear 138 for each of the drums 124 is detachable from its drum in response to axial movement of a reset rod 142 which is supported between the legs 128. The movement of the rod 142 is controlled by an electrically actuated solenoid 143. The solenoid 143 is suitably mounted between the legs 128 and includes a protruding pin 144 which is arranged for movement in an upward direction from the position shown in FIG. 14 upon the application of a reset current pulse to the solenoid winding.

The pin 144 cooperates with the bifurcated end of a reset lever 145. The lever 145 is disposed adjacent the highest order drum of the counter and is pivotally supported by a rod 146 which carries the biasing springs (not visible in FIG. 14) for the transfer arms 135. The lever 145 extends from the rod 146 in a generally downward direction with its free end in engagement with a reset arm 147, which is affixed intermediate its ends to the rod 142. This latter end of the lever 145 includes a camming surface 148 thereon in contact with the adjacent portion of the reset arm. The configuration of the surface 148 is such that, upon pivotal movement of the lever 145 about the rod 146 in a clockwise direction, as viewed in FIG. 14, the surface produces axial movement of the rod 142.

The reset rod 142 also is pivotally movable in response to movement of an angularly shaped lever 149. The lever 149 is carried by the rod 146 immediately adjacent the reset lever 145, and the lever 149 extends downwardly and laterally from the rod in substantially coextensive relationship with the adjacent portion of the lever 145. The free end of the lever 149 is resiliently urged into contact with the reset arm 147 by a spring 150.

As more fully described in the Hoffman patent, the counter is automatically reset to "0" or other null position by applying a reset current pulse to the solenoid 143. Upon energization of the solenoid 143, the actuating pin 144 moves upwardly from the position shown in FIG. 14 to pivot the reset levers 145 and 149 about the rod 146 in a clockwise direction, as viewed in this FIG. The pivotal movement of the lever 145 urges the reset arm 147 in an axial direction by reason of the configuration of the camming surface 148 to disconnect the individual driving gears 125 from their corresponding drums, while the pivotal movement of the lever 149 rapidly rotates the arm 147 and the rod 142 through a small angle. The various transfer mechanisms 133 thereupon automatically return each of the drums to the reset position.

An inhibit rod 151 is affixed to the reset lever 145 intermediate the pin 144 and the rod 146. The rod 151 extends in a direction transverse to that of the contact springs 45 and includes an insulating sleeve 152 which is located in close proximity to the springs. As the lever 145 pivots about the rod 146 in response to the reset signal, the rod 151 moves toward the springs 45, and the sleeve 152 engages the springs and carries them out of contact with the peripheral surfaces of the drums. The arrangement is such that the read-out circuitry on the printed circuit board 50 is automatically deactivated during the resetting of the drums, with the result that the reading of the drums is positively prevented as the drums return to their reset positions.

In certain advantageous embodiments of the invention, the electrical reading of the counter is inhibited during the time motion is being transferred to one or more of the higher order drums. In the embodiment of FIGS. 1–5, for example, when one of the drums 27–29 is rotated to a new position all of the contact springs 45 for that drum bear against the periphery of the drum, and the contact portions 55 and 56 are maintained in their closed positions. The computer or other read-out device which receives the electrical information from the springs 45 is programmed to reject the information from the drums in cases in which all of the contact portions for a given drum are closed. As soon as the drum reaches its new position and the lugs 35 open selected contact portions in accordance with the predetermined code, the read-out device again accepts the data from the drums.

In other preferred embodiments the transfer of the higher order drums between their successive positions is positively prevented in response to the read-out signal. In the embodiment shown in FIG. 15, for example, the transfer mechanism between the two lowest order drums includes a transfer arm 155. The configuration and mode of operation of the transfer arm 155 are generally, similar to the transfer arms described heretofore with the exception that the arm 155 includes a stepped portion 156 intermediate the compensating cam roller 88 and the planetary gears 86 and 87. The stepped portion 156 is located in position to cooperate with the free end of an inhibit lever 158 which is pivotally supported by a rod 159 extending between the legs 160 of the U-shaped frame 161. An arm 163 is affixed to the rod 159 adjacent one of its ends. This arm is controlled by a solenoid 165 carried by the adjacent leg of the frame.

Figure 15:
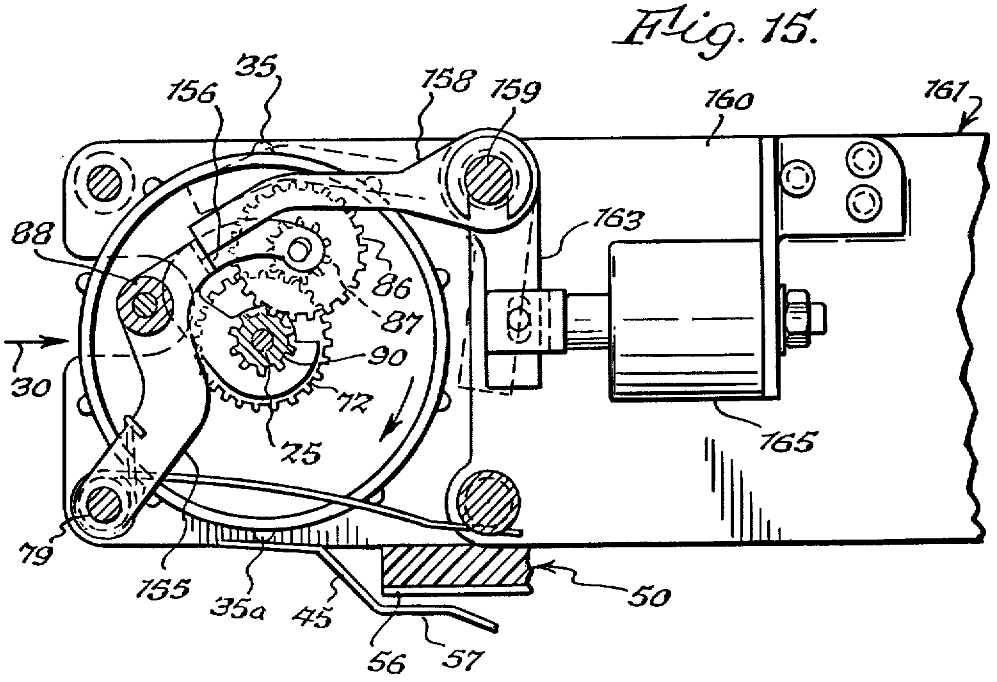
FIG. 15 is a vertical sectional view of a transfer counter in accordance with a further illustrative embodiment of the invention.

During normal operation of the counter, the solenoid 165 is in its de-energized condition, and the arm 163 and the inhibit lever 158 is located in the position shown by dotted lines in FIG. 15. In this position the free end of the lever 158 is spaced a short distance from the step 156 on the transfer arm 155. Upon the application of a read-out signal, the solenoid 165 is energized to pivot the lever 158 counterclockwise, as viewed in FIG. 15, to bring the end of the lever into engagement with the step 156. With the lever in its new position the transfer arm 155 is prevented from pivoting about the rod 79 in a direction to transfer motion to the higher order drum. As a result, the information read from the counter is in precise correspondence with the data represented by the positions of the drums immediately prior to the transfer. Upon the deenergization of the solenoid 165 at the completion of the read-out operation, the lever 158 returns to its dotted line position and thus enables the transfer arm 155 to rotate the higher order drum in the manner described heretofore.

In the illustrated embodiments of the invention the lugs or other switch actuating means are located at spaced intervals around the peripheries of the drums and alternate with the visible indicia on the drums. In other advantageous arrangements the visible indicia itself is provided with the switch actuating means. In the case of a decade counter, for example, each digit may include lugs, depressions, nonconductive portions, etc., in accordance with the predetermined code for another digit spaced ninety degrees from the first digit, such that the data read from the drums in response to a read-out signal corresponds to the data visually represented by the digits.

The read-out features of the invention also are suitable for use with devices in which the individual drums or other counting elements are movable independently of one another. In thumb wheel switches, for example, a knurled wheel commonly is affixed to each drum and is manually movable to set the drum to the desired position independently of the remaining drums. In addition, several types of counting devices include an independent drive mechanism for each drum which is actuated in response to a suitable input signal to advance the drum in accordance with the incoming data. The drums of such thumb wheel switches and other independently driven devices may include switch actuating means of the type described heretofore which cooperate with contact springs and a single printed circuit read-out board to provide a coded electrical output representative of the positions of the drums.

The printed circuit board 50 (FIG. 1) is arranged to produce a simultaneous, parallel read-out of the coded bits of information from the drums. In other good embodiments the information is read from the board in serial form. As an illustration, a ring of printed circuit commutators, one for each of the contact springs, may be provided on the board and may be successively scanned by a motor driven wiper contact in engagement therewith. Among its other advantages, this construction enables the use of only a single pair of information read-out terminals on the board.

The terms and expressions which have been employed are used as terms of description and not of limitation, and there is no intention in the use of such terms and expressions of excluding any equivalents of the feature shown and described or portions thereof, but it is recognized that various modifications are possible within the scope of the invention claimed.

What is claimed is:

1. A counting device comprising, in combination:

a plurality of indicia bearing counting elements including a lower order element and a higher order element, each of said counting elements having switch actuating at spaced intervals thereon;

mounting means for supporting the counting elements in predetermined relationship with each other;

means for operating said counting elements, the operating means including resiliently biased transfer means interconnecting said lower order element and said higher order element for transferring motion therebetween;

switching means cooperating with the switch actuating means on each of said elements for providing a circuit condition representative of the angular position of each element; and conductor means electrically connected to said switching means for sensing said circuit condition, said conductor means comprising only a single printed circuit board for all of said counting elements which is rigidly affixed to said mounting means to maintain the board in a single stationary position during both the operation of said counting elements and the sensing of said circuit condition.

2. A counting device comprising, in combination:

a plurality of indicia bearing drums including a lower order drum and a higher order drum in coaxial relationship with each other, each of said drums having switch actuating means at spaced intervals thereon;

means for rotating said drums, the rotating means including resiliently biased transfer means interconnecting said lower order drum with said higher order drum for operating said higher order drum in response to rotation of said lower order drum and in predetermined relationship therewith;

switching means continuously engaging the switch actuating means on each of said drums during its rotation for providing a circuit condition representative of the angular position of each drum;

conductor means electrically connected to said switching means for sensing said circuit condition, said conductor means comprising a single printed circuit board for all of said drums which is permanently affixed in a stationary position relative to the axis of said drums.

3. A counting device as defined in claim 2, in which the switch actuating means on each drum comprises a series of discontinuous lugs arranged in accordance with a predetermined code on the drum's periphery.

4. A counting device as claimed in claim 3, in which each discontinuous lug is of bar-shaped configuration and extends in a direction parallel to the axis of said drums.

5. A counting device as defined in claim 2, in which the switching means comprises contact fingers arrayed in a plurality of combs, one of said combs being provided for each of said drums, said contact fingers being resiliently biased into continuous engagement with the peripheries of the drums.

6. A counting device comprising, in combination:

a plurality of counting elements including a lower order element and a higher order element, said higher order element having a driving member affixed thereto and each of said elements having switch actuating means at spaced intervals thereon;

mounting means for supporting the counting elements in predetermined relationship with each other;

means for operating said lower order element;

resiliently biased transfer means interconnecting said lower order element with the driving member of said higher order element for operating said higher order element in response to operation of said lower order element and in predetermined relationship therewith;

switching means cooperating with the switch actuating means on each of said elements for providing a circuit condition representative of the position of each element; and printed circuit read-out means electronically connected to said switching means for sensing said circuit condition, said read-out means comprising a single printed circuit board for all of said counting elements which is rigidly affixed to said mounting means to maintain the board in a single stationary position during both the operation of said counting elemnts and the sensing of said circuit condition.

7. A transfer counter comprising, in combination:

a plurality of counting elements including a lower order element and a higher order element, each of said counting elements having switch actuating means at spaced intervals thereon;

mounting means for supporting the counting elements in predetermined relationship with each other;

means for operating said lower order element;

control means for operating said higher order element in response to operation of said lower order element and in predetermined relationship therewith;

switching means in continuous engagement with each of said elements during the operation thereof and cooperating with the switch actuating means to provide a circuit condition representative of the position of each element;

read-out means electrically connected to said switching means for sensing said circuit condition, said read-out means comprising a single printed circuit board for all of said counting elements which is rigidly affixed to said mounting means to maintain the board in a stationary position during both the operation of said counting elements and the sensing of said circuit condition; and means responsive to said read-out means for preventing operation of said control means during the sensing of said circuit condition.

8. A transfer counter as defined in claim 7, in which the control means includes a resiliently biased transfer arm, and the means for preventing operation of the control means includes means for preventing movement of said transfer arm in the direction of its resilient bias.

9. A couting device comprising, in combination:

a plurality of indicia bearing register drums including a lower drum and a higher order drum in coaxial relationship with each other, each of said drums having coded switch actuating means thereon;

mounting means for supporting the register drums for rotation about a central axis;

means for rotating said drums in a given direction;

reset means for rotating said drums to a predetermined position;

switching mens in continuous cooperating relationship with the switch actuating means on each of said drums during its rotation for providing a circuit condition representative of the angular position of each drum;

read-out means electrically connected to said switching means for sensing said circuit condition, said read-out means comprising a single printed circuit board for all of said drums which is rigidly affixed to said mounting means to maintain the board in a single stationary position during the rotation of the drums and the sensing of said circuit condition; and means automatically responsive to said reset means for preventing the sensing of said circuit condition during the rotation of said drums to said predetermined position.

10. A counting device as defined in claim 9, in which the means responsive to the reset means disables said switching means during the rotation of said drums to said predetermined position.

11. A transfer counter comprising, in combination:

a plurality of indicia bearing register drums including a lower order drum and a higher order drum in coaxial relationship with each other, each of said drums having coded switch actuating means thereon;

means for rotating said lower order drum in a given direction;

transfer means for rotating said higher order drum in said given direction only during selected portions of the rotation of said lower order drum and in predetermined relationship therewith;

reset means for rotating said drums in a direction opposite to said given direction;

switching means continuously engaging the switch actuating means on each of said drums during its rotation for providing a circuit condition representative of the angular position of each drum;

printed circuit read-out means electrically connected to said switching means for sensing said circuit condition, said read-out means comprising a single printed circuit board for all of said drums which is permanently affixed in a stationary position relative to the rotational axis of the drums; and means automatically responsive to said reset means for preventing the sensing of said circuit condition during the rotation of said drums in said opposite direction.

12. A transfer counter comprising, in combination:

a plurality of indicia bearing register drums including a lower order drum and a higher order drum in coaxial relationship with each other, said higher order drum having a driving member affixed thereto and each of said drums having coded switch actuating means at spaced intervals around the drum's periphery;

means for rotating said lower order drum in a given direction;

resiliently biased transfer means including a transfer arm interposed between said lower order drum and said higher order drum;

drive means carried by the transfer arm in position to engage both the lower order drum and the driving member on the higher order drum for operating said higher order drum only during selected portions of the operation of said lower drum and in predetermined relationship therewith;

switching means cooperating with the switch actuating means on each of said drums for providing a circuit condition representative of the angular position of each drum; and conductor means electrically connected to said switching means for sensing said circuit condition, said conductor means comprising a single printed circuit board for all of said drums which is permanently affixed in a stationary position relative to the axis of said drums.

13. A transfer counter as defined in claim 12, in which the switch actuating means comprises a series of discontinuous lugs on the periphery of each drum.

14. A transfer counter as defined in claim 12, in which the switch actuating means includes a series of spaced-apart depressions in the peripheral surface of each drum.

15. A transfer counter as defined in claim 12, in which at least a major portion of the peripheral surface of each drum is of electrically conductive material.

* * * * *